United States Patent [19]

Driffield et al.

[11] 4,027,160
[45] May 31, 1977

[54] INFRARED DETECTION SYSTEM WITH PARALLEL STRIP RETICLE MEANS

[75] Inventors: John B. Driffield, Rexdale; Howard S. Kerr, Scarborough; Richard M. Penrose, Brampton; Anthony C. Stonell, Rexdale, all of Canada

[73] Assignee: The United States of America as represented by the Secretary of the Army, Washington, D.C.

[22] Filed: May 18, 1971

[21] Appl. No.: 144,282

[52] U.S. Cl. .................................. 250/339; 350/2; 250/338
[51] Int. Cl.² ........................................ G01J 1/00
[58] Field of Search ................ 250/83.3 R, 83.3 H; 73/355 R; 350/1, 2

[56] References Cited
UNITED STATES PATENTS

| | | | |
|---|---|---|---|
| 3,144,554 | 8/1964 | Whitney | 250/83.3 H |
| 3,204,100 | 8/1965 | Wormser et al. | 250/83.3 H |
| 3,279,308 | 10/1966 | Bartz et al. | 350/1 X |
| 3,318,650 | 5/1967 | Papp | 250/83.3 H |
| 3,353,022 | 11/1967 | Schwartz | 250/83.3 H |
| 3,398,285 | 8/1968 | Sachs | 250/83.3 H |
| 3,402,296 | 9/1968 | Benedict et al. | 250/83.3 H |
| 3,448,283 | 6/1969 | Higley et al. | 250/83.3 H |
| 3,519,825 | 7/1970 | Locks | 250/83.3 H |
| 3,853,386 | 12/1974 | Ritter et al. | 350/1 X |
| 3,872,308 | 3/1975 | Hopson et al. | 250/338 X |
| 3,879,607 | 4/1975 | Bjorkland | 250/339 X |

*Primary Examiner*—Peter A. Nelson
*Attorney, Agent, or Firm*—Nathan Edelberg; Robert P. Gibson; Aubrey J. Dunn

[57] ABSTRACT

Optical detectors are arranged along the focal length of a spherical mirror. Signals passed by a lens and reflected by the mirror impinge on the detectors as the system scans the horizon. A reticle means is placed between the mirror and the detector to cause the optical system to discriminate against large radiating areas in the field of view of the lens. The reticle means may be straight or zig-zag opaque lines. The cross-sectional area of the lines and the area therebetween is such that radiation from point sources will impinge the detector in only one area at a time while radiation from large sources will overlap a plurality of areas. The output frequency from the detectors is indicative of the type of the radiation source.

2 Claims, 11 Drawing Figures

INFRARED DETECTION SYSTEM WITH PARALLEL STRIP RETICLE MEANS

BACKGROUND OF THE INVENTION

Present infrared detection systems for the acquisition of target positional information may be divided into two general classes: passive and active systems. The most common of these, the passive system, utilizes only the radiation omitted by the target to supply the input signal. The more complicated, active system irradiates the target with an auxiliary source of infrared. An important disadvantage of the active system, from the military point of view, is that it can betray its location to an enemy. Although the present invention is applicable to both systems, the system of the preferred embodiment, herein described, is a passive system.

Passive infrared detection systems comprise, essentially, an optical scanning unit which receives infrared emission from all objects in its field of vision, an infrared detector of the class of materials which produce a small emf proportional to the amount of radiation received, and which includes lead sulphide, indium antimonide and others; an amplifying system including an electrical filter; and a visual display system for positional plotting of the signals. The main disadvantage with present systems is the difficulty experienced by the operator in discriminating between signals generated by a genuine target such as an aircraft, and spuriour signals, generated by background "noise", which clutter the display screen. Such noise is produced by emission from matter in suspension in the atmosphere such as clouds and the like which reflect sunlight, as well as from many different man-made sources near the horizon.

SUMMARY OF THE INVENTION

This invention relates to target acquisition by infrared detection means and more particularly to means for improving discrimination between target and background signals. Optical detectors are arranged along the focal length of a spherical mirror. Signals passed by a lens and reflected by the mirror impinge on the detectors as the system scans the horizon. A reticle means is placed between the mirror and the detector to cause the optical system to discriminate against large radiating areas in the field of view of the lens. The reticle means may be straight or zig-zag opaque lines. The cross-sectional area of the lines and the area therebetween is such that radiation from point sources will impinge the detector in only one area at a time while radiation from large sources will overlap a plurality of areas. The output frequency from the detectors is indicative of the type of the radiation source.

It is the primary object of this invention to provide means for detecting infrared radiation and producing an electrical signal responsive thereto, and including means for the differentiation of signals produced by point sources of radiation and signals which are produced by large areas of radiation, so that the latter may be suppressed.

DESCRIPTION OF THE PREFERRED EMBODIMENT

Figure 1:
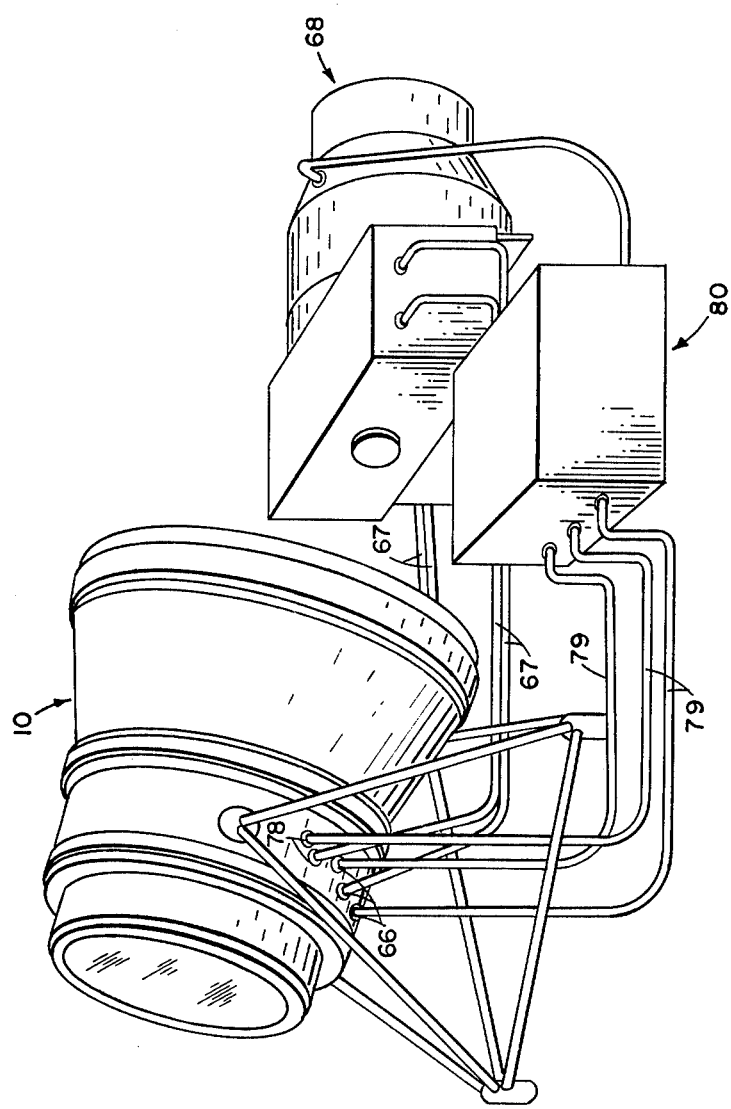
FIG. 1 is a general view, in perspective, of an optical scanner according to the invention together with associated equipment of an infrared detection system.
Figure 2:
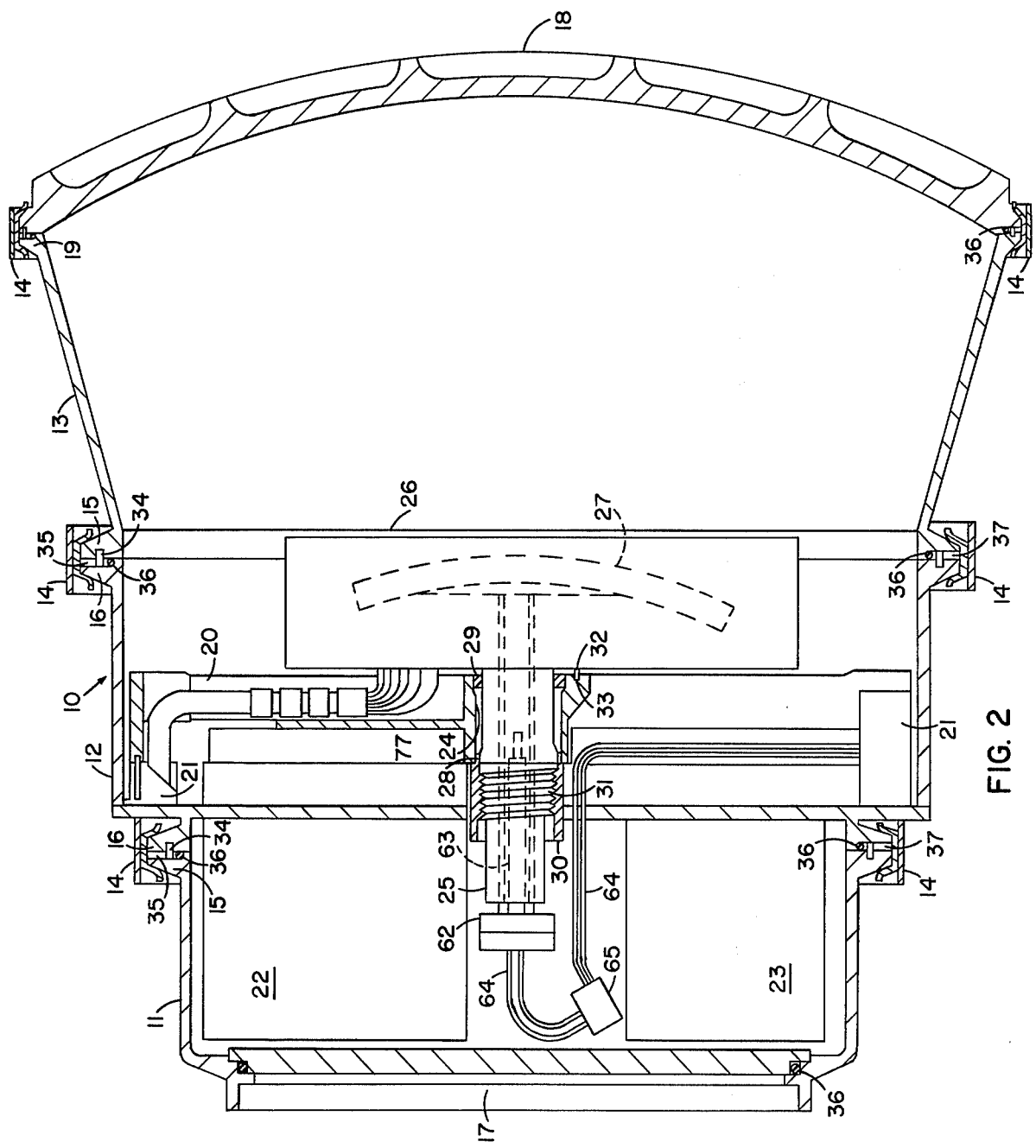
FIG. 2 is a side elevation, in section, of an optical scanning unit according to the present invention.
Figure 5:
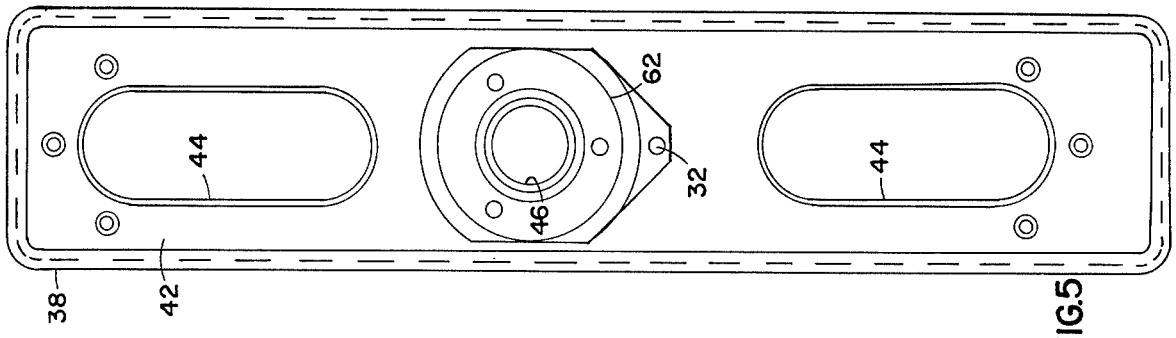
FIG. 5 is a rear elevation of the detector dewar in FIG. 3.
Figure 4:
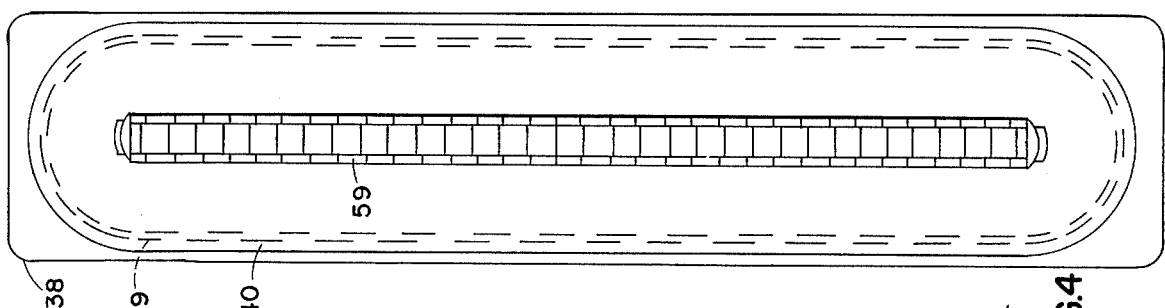
FIG. 4 is a front elevation of the detector dewar in FIG. 3.
Figure 3:
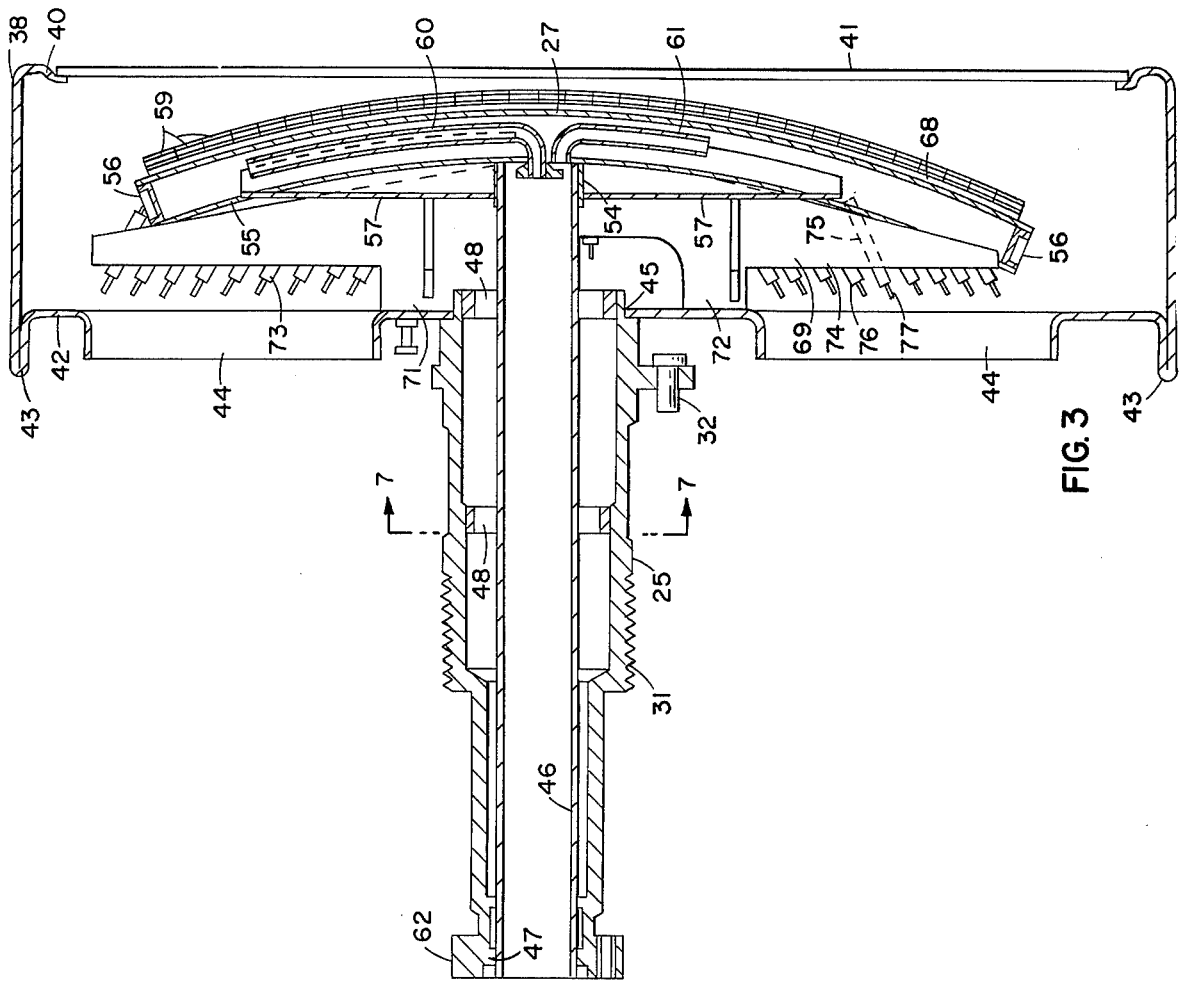
FIG. 3 is a side elevation, in section and on an enlarged scale, of the detector dewar of the scanner.
Figure 6:
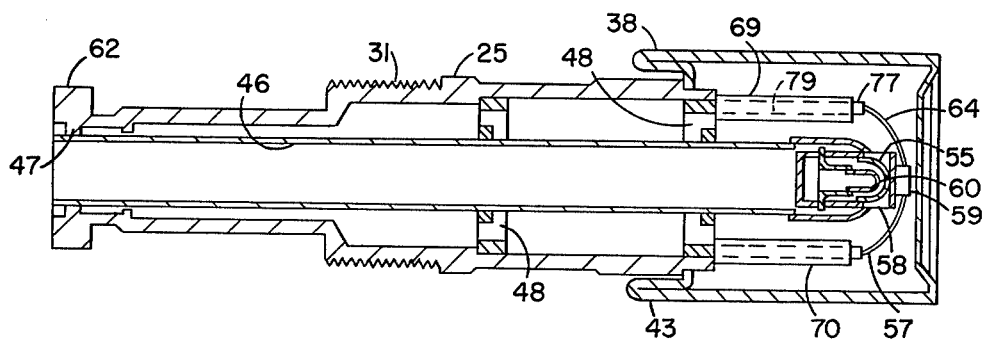
FIG. 6 is a plan view in section of the detector dewar in FIG. 3.
Figure 7:
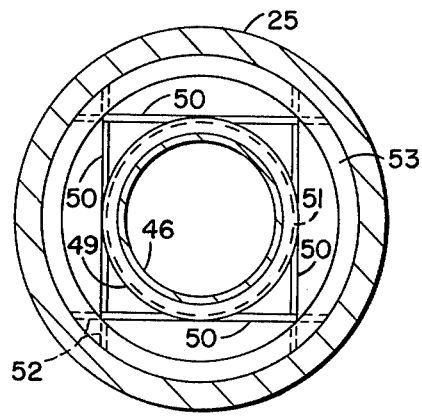
FIG. 7 is a further enlarged sectional view taken along the line 7—7 in FIG. 3.

Referring to FIG. 1 and more particularly to FIG. 2, it may be seen that an infrared optical scanning unit according to the invention comprises a casing generally indicated 10 which is made up of three releasably connected sections; a cylindrical aspheric ring 11, a center ring 12 of larger diameter, and a mirror cone 13 of truncated cone form. The casing sections are joined together by means of V-section band clamps 14 of the Marman (Reg. trade mark) type, which embrace radial flanges such as 15 and 16 integrally formed on the peripheral ends of the casing sections. A free end of the aspheric ring 11 is adapted to support a aspheric corrector 17 of optical silicon, but which may be of other suitable materials such as Irtran 1, for example. The aspheric corrector 17 acts as a viewing window for the scanner and is shaped to correct the optical system for spherical aberration. Since optical silicon has a cut-on wavelength of approximately one micron, radiation of shorter wavelenght is excluded from the scanner and its absence prevents "flash effect" common in lead salt and other photo-voltaic detectors. The mirror cone supports a spherical mirror 18 which is spigotted to a radial flange 19 and secured with a clamp 14. Made from high tensile aluminum alloy or beryllium, the optical surface of the mirror is aluminized and given an overcoat of silicon monoxide for maximum reflectivity in the wavelength region of 3 to 5 microns. The focal point of the mirror at the optical axis lies exactly in the plane of the joint between the center ring 12 and the mirror cone 13. As the mirror and mirror cone are both made from the same material, the position of the focal point will remain at its design position at all thermal levels due to thermal scaling effect.

A narrow, channel-section, vertical beam 20 extends diametrically of the center ring 12, bolted thereto at both ends through the medium of blocks 21. The beam carries two vertically disposed packs of preamplifier modules, an upper pack 22 and a lower pack 23, which extend forwardly into the aspheric ring 11. Between the packs, a bore 24 received a hollow stem 25 of a metal dewar 26 which contains a multi-cell detector bridge 27. The stem 25 is supported in the bore 24 by two, flanged collars 28 and 29 and retained by a sleeve-nut 30 on a threaded portion 31 of the stem. The stem 25 also carries a dowel pin 32, which cooperates with a hole 33 in the beam 20 to locate the dewar. The design of the dewar/center ring assembly is such that ambient temperature variations which cause dimensional changes in the components cancel out when the dewar is at operating temperature, since it is obviously essential tha the detector cell reticles (to be described later) are maintained at the focal surface of the mirror 18. The center ring 12 is of stainless steel, the aspheric ring 11 is aluminum and the mirror cone 13 is of aluminum or beryllium. To prevent axial misalignment between the casing sections, through differential thermal expansion, three equi-angularly disposed dowels such as 34, set in the mating faces of flanges 15, are arranged to slidably locate in radial slots 35 in the faces of flanges 16. All joints between the sections of casing 10 are sealed by means of O-rings 36 in annular grooves 37 in the joint faces and the casing is filled with a dry air or an inert gas atmosphere.

Referring now more particularly to FIGS. 3 through 7, it may be seen that the dewar 26 comprises, generally, an open-sided, rectangular box-like casing 38 die-pressed from a sheet of metal such as kovar, an iron nickel alloy suitable for use with glas-to-metal seals and having good vacuum retaining properties. A large aperture 39, having semi-circular ends, in the casing wall opposite the open side, receives a joggled insert 40 braized therein. Bonded to the insert 40 is a sapphire window 41. The open side of the casing receives a flanged back plate 42 which is welded into position in the manner seen at 43. Two elongated, flanged slots 44 in the back plate 42 house electrical headers (not shown for clarity) which are sealed in position and which pass electrical conductors from the detector cells to the preamplifiers as will be described later herein. A circular aperture 45 in the back plate 42 receives the spigotted end of hollow stem 25, which is brazed in position.

A thin-wall, stainless-steel access tube 46 is supported coaxially within the stem 25, one end of the tube being brazed to an internal flange 47. Another end of tube 46 and an intermediate portion thereof are supported by wire suspension mounts 48 more clearly shown in FIG. 7. An inner annulus 49 supporting tube 46 is itself supported between a first pair of parallel, tangentially disposed wires 50 crimped into one of two peripheral grooves such as 51 in the annulus. A second pair of wires 50 is similarly attached to the inner annulus 49 in a second peripheral groove 51 and disposed normally to the first pair of wires. The free ends of the wires 50 are drawn taut through holes such as 52 in an outer annulus 53 and brazed therein. The outer annulus 53 is supported in the bore of the dewar stem 25. Access tube 46 extends beyond the stem 25 into the casing 38 and terminates in a domed stainless-steel cap 54. The dome end is opened to receive, brazed therein, the vertically disposed, detector bridge 27 comprising an arcuate, thin-wall, stainless-steel tube 55 having upper and lower end plugs 56, and upper and lower channel-section brace members 57 brazed to the tube and end cap. A stainless-steel strip is welded along the length of tube 55 to provide a mounting platform 58 for a series of thirty-two small detector cells 59 which are secured to the strip by hollow rivets or other suitable means. The detector bridge is carefully formed and mounted in the dewar so that when the latter is properly assembled, in the center ring 12 the reticles of the detector cells all lie at the focal length of the optical system. How this relationship is maintained under conditions of thermal expansion has already been explained. From inside the cap 54, a stack pipe 60 extends through the wall of tube 55, upwardly within the bore of the tube; a shorter stack pipe 61 extends likewise through the wall of tube 55 from inside cap 54 and extends downwardly within the bore of the tube.

As seen in FIG. 2, a flanged end 62 of the dewar stem 25 receives, releasably attached thereto, a cooperating joint flange of a two-fluid, heat exchanger probe 63 which extends into the access tube. Conduits such as 64 connect the heat exchanger 63 through a coupling block 65 to quick-disconnect unions 66 (FIG. 1) in the wall of center ring 12, from which external lines 67 connect to a separate refrigeration unit 68. The refrigeration unit may be of any suitable type which will maintain the detector bridge and its cells at a temperature of 80° K, which is the temperature for optimum deteictivity in the cells. The preferred embodiment uses a Freon 14 and Nitrogen system in cascade, the second refrigerant, nitrogen, passing from the heat exchanger 63 into the bridge tube 55 through stack pipe 60 back to the heat exchanger via stack pipe 61 and access tube 46.

Returning to FIGS. 3 and 6, within the dewar casing 38, two conductor bridges 69 and 70 flank detector bridge 27 in spaced relationship thereto. Bridge 69 has abutments 71 and 72, which are brazed to back plate 42 and cantilever arms 73 and 74. The arms are obliquely bored as at 75 to receive short ceramic tube insulators such as 76 which carry conductor leads 77. Bridge 70 is precisely similar. Free ends of the conductors are soldered or welded to electrodes on the detector cells 59 and lead away from the bridges through the afore-mentioned headers in slots 44 in backplate 42 to the preamplifier modules 22 and 23 as may be seen in FIG. 2. The dewar casing is evacuated to a high degree of vacuum. The preamplifier modules are connected through other leads (not shown) to quick-disconnect couplings 78 (FIG. 1) in the wall of center ring 12, and external leads 79 connect to an exterior electronic pack 80 which processes the signals from the detectors. The electronic pack comprises conventional units and, not forming part of the present invention, will not be described in detail.

The detector cells 59 will now be described with reference to FIG. 8 through 11 which show a rectangular, stainless-steel body 81 formed with lateral flanges 82 and 83 having slotted holes 84 and 85 respectively therein at diagonally opposed stations, to provide securing means for the cell. A rectangular chamber 86 in the body 81 houses an infrared detector element 87. Detector 87 is a block of indium antimonide, insulatingly fastened to the floor of the chamber through the medium of a beryllium oxide sub-base 88 nickel plated on top and bottom surfaces and soldered to the underside or detector 87 and to the floor of the chamber. The sides of detector 87 are spaced from the walls of the chamber to leave a narrow gap therearound. An infrared-sensitive surface 89 is formed, by any of the techniques well known in the art, on the upper surface of detector 87 and a central terminal 90 is soldered thereto.

At stations clear of holes 84 and 85 wire electrodes 91 and 92 pass through slotted apertures 93 and 94 in the walls of body 81. The electrodes, which may be of untinned kovar, monel, inconel or copper-nickel alloy are insulatingly sealed in the slots by a dialectric apoxy resin 95 or the like. A connecting lead 96 extends from electrode 91 to terminal 90; a lead 97 connects electrode 92 with the body of detector 87.

Figure 11:
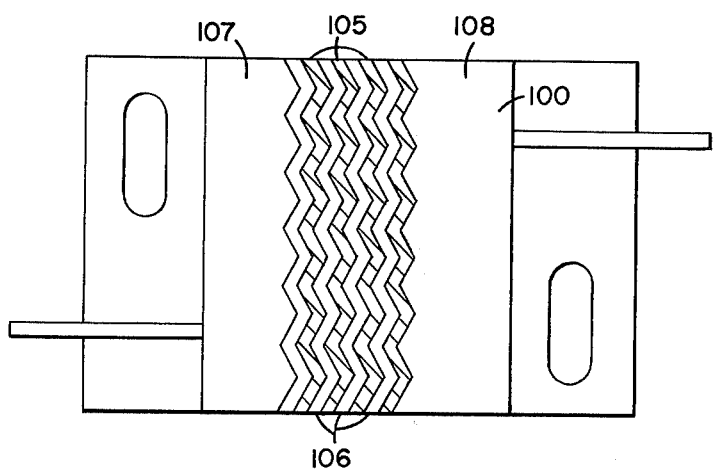
FIG. 11 is a similar view to that of FIG. 10 showing a second embodiment of a picket fence reticle.
Figure 8:
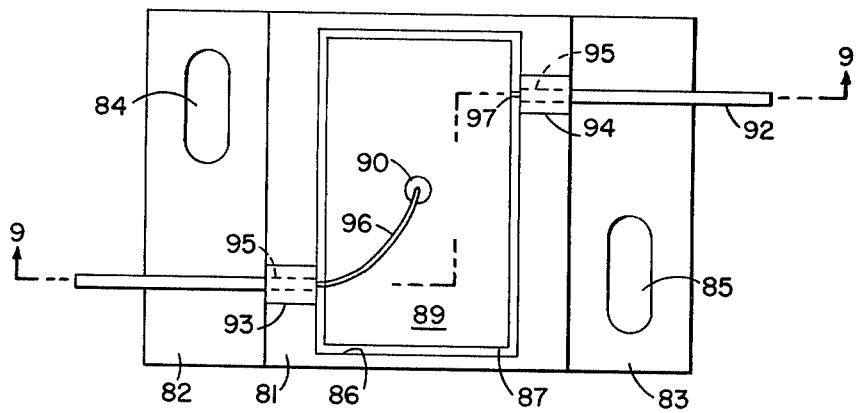
FIG. 8 is a greatly enlarged plan view of a single detector cell with the complete reticle removed to show the infrared detector element.

Covering chamber 86 is a composite reticle indicated at 98 which comprises a sapphire substrate 99 having deposited on an outer surface thereof a "picket fence" reticle 100 of an opaque material, such as aluminum, having an optical density greater than 3 at a wavelength of 3.5 microns. The edges of the sapphire reticle are also opaqued to exclude radiation. As more clearly shown in FIG. 10 reticle 100 provides alternate parallel opaque bars 101 and clear windows 102 of equal width and flanked by wide opaque portions 103 and 104. The embodiment shown in FIG. 11 shows opaque bars 105 and clear windows 106 of zig-zag configuration, flanked by wide opaque portions 107 and 108. In all other respects the cell is the same as that shown in FIG. 10. Superimposed upon the picket fence reticles is an interference filter 109 of silicon oxide, which permits the passage of infrared radiation in the wavelength range of 3.2 to 4.2 microns.

In operation: the scanning unit 10, together with its accompanying cooling unit 68 and electronic pack 80 are mounted on a power-driven turntable (not shown) which enables the unit continuously to scan a full azimuth circle at a rate of forty revolutions per minute. The detector cells 59 view an elevational angle from 5° below the horizon to 40° above it; commutation means in the electronic unit samples these cells at the rate of 1 kilocycle per second. The instantaneous azimuth field of view of each detector cell over the full width of the picket fence reticle is of the order of 39 minutes of arc; the picket windows and bars are kept within very close tolerances to 0.010 inches in each case. The elevational field of view of a cell is about 1° and 24 minutes.

At the instant of samplings, any particular cell "seeing" a beam of radiation, which is focussed on to the reticle by the optical system and passed by the filter 109, produces a small emf. With a plain reticle a single pulse signal would be generated from a point source of emission but the signal generated by a large area emitting radiation, such as a cloud, would tend to be longer and slightly different in shape. However the electrical filter will discriminate between these signals only to a limited degree and, as a result, clouds of sufficient brightness will generate signals which will pass through the filter and be displayed along with point-source signals. Under noisy sky conditions, therefore, background signals will clutter the display screen and tend to obliterate point-source signals which are likely to be genuine targets.

With cells having picket fence reticles, the optics are such as to be able to produce a blur circle which alternately fits on and between the reticle pickets as they pan point-source emission. The signal produced by these detectors looks like a short burst of alternating, high-frequency sine wave. Clouds produce a large fuzzy image which overlaps a number of pickets and gives a signal having little high-frequencey content. In processing amplified detector signals with a narrow band filter, centered to pass the high-frequency sine wave characteristics produced by point-source emission, a considerable amount of the background signals will be filtered out and thus will not reach the display.

Figure 9:
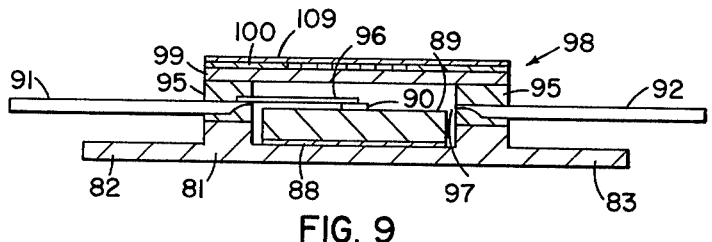
FIG. 9 is a side elevation, in section, of the detector cell, taken along line 9—9 in FIG. 7 and including the composite reticle.
Figure 10:
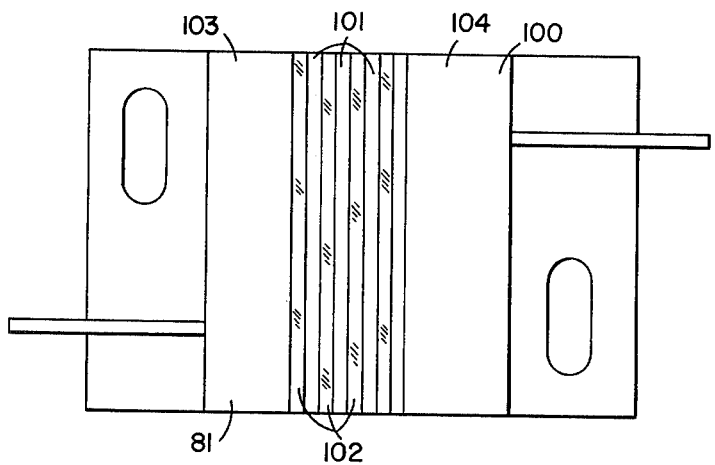
FIG. 10 is a similar view of that of FIG. 8 with the filter removed to show a first embodiment of a "picket fence" reticle.

The zig-zag reticle depicted in FIG. 10 is a refinement of the straight picket reticle of FIG. 9 and is designed to discriminate between point source emission and narrow, vertical band emission, such as might be expected from a factory chimney on the horizon for example, in addition to large area emission as above. Emission from a vertical strip source would not be cleanly chopped and only half the energy from such a source would reach the detector. Such low amplitude signals would not be passed by the filter and thus would not reach the display unit.

We claim:

1. An optical system for infrared detection comprising: a viewing lens; a mirror having a focal length, said mirror being positioned to receive the light passed by said viewing lens; a plurality of detector cells positioned to lie in the focal length of said mirror; reticle means positioned on said detector cells whereby said optical system differentiates between infrared radiation from large sources and point sources, wherein said mirror is a spherical mirror having an overcoat of silicon monoxide thereby providing maximum reflectivity in the wavelength region of 3 to 5 microns, wherein said viewing lens is an aspheric corrector shaped to correct said optical system for spherical aberration, said lens comprising optical silicon having a cut-on wavelength of approximately one micron thereby excluding radiation of less than one micron from said optical system, and wherein said reticle means is positioned between said mirror and said detector cells, said reticle means comprising a sapphire substrate having a reticle of parallel strips of an opaque material thereon.

2. An optical system as set forth in claim 1 wherein said strips of said opaque material are zig-zags whereby said optical system discriminates between point sources of emission and narrow, vertical band emission.

* * * * *